United States Patent
Slot et al.

(10) Patent No.: US 9,244,726 B2
(45) Date of Patent: Jan. 26, 2016

(54) NETWORK ARCHITECTURE FOR LITHOGRAPHY MACHINE CLUSTER

(75) Inventors: Erwin Slot, Zoetermeer (NL); Marcel Nicolaas Jacobus Van Kervinck, The Hague (NL); Vincent Sylvester Kuiper, The Hague (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 717 days.

(21) Appl. No.: 13/453,008

(22) Filed: Apr. 23, 2012

(65) Prior Publication Data

US 2013/0037730 A1 Feb. 14, 2013

Related U.S. Application Data

(60) Provisional application No. 61/533,673, filed on Sep. 12, 2011, provisional application No. 61/478,117, filed on Apr. 22, 2011.

(51) Int. Cl.

| | |
|---|---|
| G05B 15/00 | (2006.01) |
| G06F 9/48 | (2006.01) |
| G03F 7/20 | (2006.01) |
| H01J 37/317 | (2006.01) |
| B82Y 10/00 | (2011.01) |
| B82Y 40/00 | (2011.01) |

(52) U.S. Cl.
CPC . *G06F 9/48* (2013.01); *B82Y 10/00* (2013.01); *B82Y 40/00* (2013.01); *G03F 7/70508* (2013.01); *G03F 7/70525* (2013.01); *G03F 7/70991* (2013.01); *H01J 37/3177* (2013.01)

(58) Field of Classification Search
CPC ............ G03F 7/70991; G03F 7/70508; G03F 7/70525; B82Y 10/00; B82Y 40/00; G06F 9/48; H01J 37/3177

USPC .................................. 700/73, 83; 250/492.22
See application file for complete search history.

(56) References Cited

U.S. PATENT DOCUMENTS

| | | | |
|---|---|---|---|
| 5,243,377 A | 9/1993 | Umatate | |
| 5,778,386 A | 7/1998 | Lin | |
| 6,011,952 A * | 1/2000 | Dankberg et al. ............... | 455/24 |

(Continued)

FOREIGN PATENT DOCUMENTS

WO     2010134026 A2    11/2010

*Primary Examiner* — Mohammad Ali
*Assistant Examiner* — Yuhui R Pan
(74) *Attorney, Agent, or Firm* — Hoying Rock Monegier LLP; David P. Owen

(57) ABSTRACT

The invention relates to a clustered substrate processing system comprising a plurality of lithography elements. Each lithography element is arranged for independent exposure of substrates according to pattern data, and comprises a plurality of lithography subsystems, a control network arranged for communication of control information between the lithography subsystems and at least one element control unit, the element control unit arranged to transmit commands to the lithography subsystems and the lithography subsystems arranged to transmit responses to the element control unit, and a data network arranged for communication of data logging information from the lithography subsystems to at least one data network hub, the lithography subsystems arranged to transmit data logging information to the data network hub and the data hub arranged for receiving and storing the data logging information. The system further comprises a cluster front-end for interface to an operator or host system.

21 Claims, 3 Drawing Sheets

(56) References Cited

U.S. PATENT DOCUMENTS

| | | |
|---|---|---|
| 6,714,830 B2 | 3/2004 | Browning |
| 6,897,458 B2 | 5/2005 | Wieland et al. |
| 6,958,804 B2 | 10/2005 | Wieland et al. |
| 7,019,908 B2 | 3/2006 | van 't Spijker et al. |
| 7,084,414 B2 | 8/2006 | Wieland et al. |
| 7,129,502 B2 | 10/2006 | Kruit |
| 7,149,792 B1 * | 12/2006 | Hansen et al. ............... 709/220 |
| 2002/0120417 A1 | 8/2002 | Naya et al. |
| 2004/0125355 A1 * | 7/2004 | Naya et al. .................. 355/133 |
| 2006/0102853 A1 * | 5/2006 | Heinitz et al. ............ 250/491.1 |
| 2007/0064213 A1 | 3/2007 | Jager et al. |
| 2007/0067725 A1 * | 3/2007 | Cahill et al. ................ 715/733 |
| 2007/0142950 A1 | 6/2007 | Okita |
| 2007/0203873 A1 | 8/2007 | Jeunink |
| 2007/0219736 A1 | 9/2007 | Okita |
| 2009/0212229 A1 | 8/2009 | Wieland et al. |
| 2009/0261267 A1 | 10/2009 | Wieland et al. |
| 2011/0073782 A1 | 3/2011 | Wieland |
| 2011/0079730 A1 | 4/2011 | Wieland |
| 2011/0216299 A1 | 9/2011 | Steenbrink et al. |
| 2012/0091318 A1 | 4/2012 | Wieland et al. |
| 2012/0091358 A1 | 4/2012 | Wieland et al. |

* cited by examiner

NETWORK ARCHITECTURE FOR LITHOGRAPHY MACHINE CLUSTER

BACKGROUND OF THE INVENTION

1. Field of the Invention

The invention relates to a clustered substrate processing system comprising a plurality of lithography elements each arranged for independent exposure of substrates according to pattern data, and more particularly to network architecture for such a clustered substrate processing system.

2. Description of the Related Art

In the semiconductor industry, an ever increasing desire exists to manufacture structures with high accuracy and reliability. In lithography systems this desire results in extremely high demands with respect to the amount and the speed of production of wafers. Lithography machines have become more complex with numerous subsystems for performing various functions within the machine, and complex software to control the operation of the subsystems. Modern lithography machines typically generate large amounts of data operation and managing the data has become increasingly difficult. Lithography machines may be grouped together in a cluster of lithography elements to provide higher volume production. Transmission of information within such a cluster of lithography elements for control and data collection has become a problem as the amount of information to transmit increases and the complexity of the systems creases.

Network architectures exist which combine control and data services into a single network and use quality of service techniques to prioritize delivery of certain data to provide timely delivery of critical control data, but have proven to be insufficient in this environment. The present invention provides an alternative solution for a network architecture to provide timely delivery of critical control data and collection of large amounts of data for a cluster of lithography elements.

BRIEF SUMMARY OF THE INVENTION

It is desirable to cluster a plurality of lithographic machines wherein control and data services are accommodated in the cluster network architecture. In one aspect the invention provides a clustered substrate processing system comprising a plurality of lithography elements, each lithography element arranged for independent exposure of substrates according to pattern data. Each lithography element comprises a plurality of lithography subsystems, a control network arranged for communication of control information between the lithography subsystems and at least one element control unit, the element control unit arranged to transmit commands to the lithography subsystems and the lithography subsystems arranged to transmit responses to the element control unit, and a data network arranged for communication of data logging information from the lithography subsystems to at least one data network hub, the lithography subsystems arranged to transmit data logging information to the data network hub and the data hub arranged for receiving and storing the data logging information. The system further comprises a cluster front-end for interface to an operator or host system, the cluster front-end arranged for transmitting control information to the at least one element control unit to control operation of the lithography subsystems for exposure of one or more wafers, and the front-end further arranged for receiving at least a portion of the data logging information received by the data network hub.

The control network forms a control network path between the element control unit and the lithography subsystems, and the data network forms a data network path between the data network hub and the lithography subsystems, and the control network path and the data network path may comprise physically separate media. The control network may have its own wiring and switches used for transmitting data in the control network, which are not used in the data network. Similarly, the data network may have its own wiring and switches used for transmitting data in the data network, which are not used in the control network. This separation of components between the two networks prevents or reduces interference between the two networks, so that high loading or congestion in one network does not affect the other network.

Each lithography subsystem may have a first connection to the control network, the first connection arranged to receive the commands from and transmit the responses to the element control unit via the control network, and each lithography subsystem may also have a separate second connection to the data network, the second connection adapted to transmit the data logging information to the data network hub via the data network. Separate connections to the control and data networks for each subsystem may be used to reduce interference between transmitting and/or receiving data from the control network simultaneously with transmitting and/or receiving data from the data network.

The element control unit may also be arranged for communication to the data network hub of data relating to the commands transmitted to the lithography subsystems and the responses received from one lithography subsystem via the control network. This connection enables the data network hub to store subsystem command and response information as well as the data logging data from the subsystems. This enables both types of data to be stored in one data storage system without requiring the data network hub to communicate over the control network.

During operation of one of the lithography elements, the lithography subsystems of the lithography element may be arranged to continuously transmit the data logging information to the data network hub via the data network. The subsystems may be arranged to transmit the data logging information while operating without requiring instruction from the data network hub to begin. The data logging information may include data identifying the subsystem sending the data logging information together with measurement data derived from subsystem sensors and timestamp data indicating time for the measurements.

The system may further comprise a data path arranged for transmission of the pattern data to one or more of the lithography subsystems, the data path forming a transmission path separate from the control network and the data network. The data path may comprise a pattern processing system and a pattern streaming system. The pattern data is used by the lithography element for control and modulation of the beamlets for exposing each substrate. The pattern data may be supplied from the data path to a beamlet switching or modulation subsystem, to enable switching or modulation of the beamlets during exposure of a substrate. The pattern data may be transmitted to the beamlet switching or modulation subsystem without being transmitted over the control network or data network. Such pattern data typically comprises a very large volume of data for each field on the substrate to be exposed, and providing a data path separate from the control and data networks avoids congestion of the networks due to transmission of this data.

The data network hub may store information required for initializing the lithography subsystems, the initialization information for a lithography subsystem being transmitted to the lithography subsystem during start-up of the lithography subsystem. The initialization information may comprise the basic operating system software for the processors of the subsystems, default or predetermined settings and parameters to be used by the subsystems, and/or application software to run on the subsystems processors to cause the subsystems to perform their functions. The data network hub may function as the boot node for the subsystems. The data network hub may also store information indicating which initialization information is to be transmitted to which subsystem, to enable different information to be stored for different subsystems. Storage of the initialization information by the data network hub provides an efficient way to provide a single repository for the information for multiple subsystems, and can be used to avoid requiring each subsystem to include a large non-volatile memory to store the subsystem's initialization information. Software updates, upgrades, and/or fixes for the initialization information can be downloaded to the data network hub and stored there for subsequent download to the subsystems. This design enables efficient modification of the initialization information without disturbing the subsystems during operation and without requiring transmission across the control or data network during such modification.

At least one of the lithography subsystems may be arranged to communicate information to the element control unit upon start-up of the lithography subsystem, the information indicating a presence of the lithography subsystem on the control network and an identity of the lithography subsystem, and identifying one or more commands which the lithography subsystem is able to perform. The element control unit may be configured without having the information about the identity of subsystems connected to the control network and the commands which each subsystem is able to perform prior to the subsystems themselves providing this information. This design makes it easier to modify or upgrade one of the lithography elements, by modifying or upgrading the individual subsystems connected to the control network, and without requiring modification or upgrade of the element control unit. For example, the software for a subsystem can be upgraded to enable the subsystem to perform a new or modified command, and a new process program can be written which requires the new or modified command to be performed by the subsystem. Upon start-up of the subsystem it will report to the element control unit that it can perform the new or modified command, and the element control hub may subsequently schedule a process job for the process program to execute the new or modified command on the subsystem.

The control network may be arranged for communication of servicing information between the element control unit and the lithography subsystems, and the cluster front-end may be adapted for issuing servicing information for performing servicing functions on the one or more lithography elements. In this way, servicing actions can be performed from the same interface used for control functions, and the transmission of servicing information does not require separate network facilities.

The system may be arranged to provide two clock signals to the lithography subsystems, one of the clock signals having a clock frequency at least 100 times higher than the other clock frequency, and wherein the lithography subsystems are arranged to use the clock signals to synchronize their actions. The two clock signals provide sync clocks to the subsystems for different timing accuracies. For example, one clock signal may be accurate in milliseconds and the other in nanoseconds.

The lithography subsystems may be provided with no interface to the operator or host system, such interface to the subsystems being provided solely via the cluster front-end. The operator or host system need only a single interface to the cluster front-end. An interface to the multiple different subsystems is to not required, simplifying the design and enabling modifications to the subsystems without requiring modification to the interface to the operator or host systems. A user may design their own interface to the clustered substrate processing system by making an interface to the front-end, without detailed knowledge of the internal architecture and protocol of the control network and data network.

The lithography subsystems may be arranged to transmit data to the data network at a first transmission rate and the data network hub may be arranged to receive data from the data network at a second transmission rate, wherein the second transmission rate is much greater than the first transmission rate. A maximum data exchange may be set for data transmission between the subsystems and the data network, and a much higher maximum data exchange may be set for data transmission between the data network and the data network hub.

In another aspect, the invention comprises a method for communication of data within a clustered substrate processing system comprising a plurality of lithography elements, each lithography element arranged for independent exposure of substrates according to pattern data, and each lithography element comprising a control network connecting an element control unit with a plurality of lithography subsystems, a data network connecting a data network hub with the plurality of lithography subsystems, and a cluster front-end. The method comprises transmitting control information from the element control unit to one or more of the lithography subsystems via the control network, transmitting responses from the lithography subsystems to the element control unit via the control network, transmitting data logging information from the lithography subsystems to the data network hub, receiving and storing the data logging information in the data network hub, transmitting control information from the cluster front-end to the element control unit to control operation of the lithography subsystems for exposure of one or more of the substrates, and transmitting at least a portion of the data logging information stored by the data network hub to the cluster front-end.

The control information transmitted to the lithography subsystems and the responses from the lithography subsystems may be transmitted to the element control unit only via the control network, and the data logging information from the lithography subsystems may be transmitted to the data network hub only via the data network. The method may further comprise transmitting, from the element control unit to the data network hub, data relating to the commands transmitted to the lithography subsystems and the responses received from one lithography subsystem. Transmitting the data logging information from a lithography subsystem to the data network hub may be performed continuously during performance of a command by the lithography subsystem.

The method may further comprise transmitting pattern data to one or more of the lithography subsystems via a data path, the data path forming a transmission path separate from the control network and the data network. The method may also comprise storing information required for initializing the lithography subsystems in the data network hub, and transmitting the initialization information to a lithography subsystem during start-up of the lithography subsystem. Method may also comprise communicating information to the element control unit from one of the lithography subsystems upon start-up of the lithography subsystem, the information indicating a presence of the lithography subsystem on the control network and an identity of the lithography subsystem, and identifying one or more commands which the lithography subsystem is able to perform.

BRIEF DESCRIPTION OF THE DRAWINGS

Embodiments of the invention will now be described, by way of example only, with reference to the accompanying schematic drawings in which.

DESCRIPTION OF ILLUSTRATIVE EMBODIMENTS

The following describes certain embodiments of the invention, given by way of example only and with reference to the figures.

Figure 1:
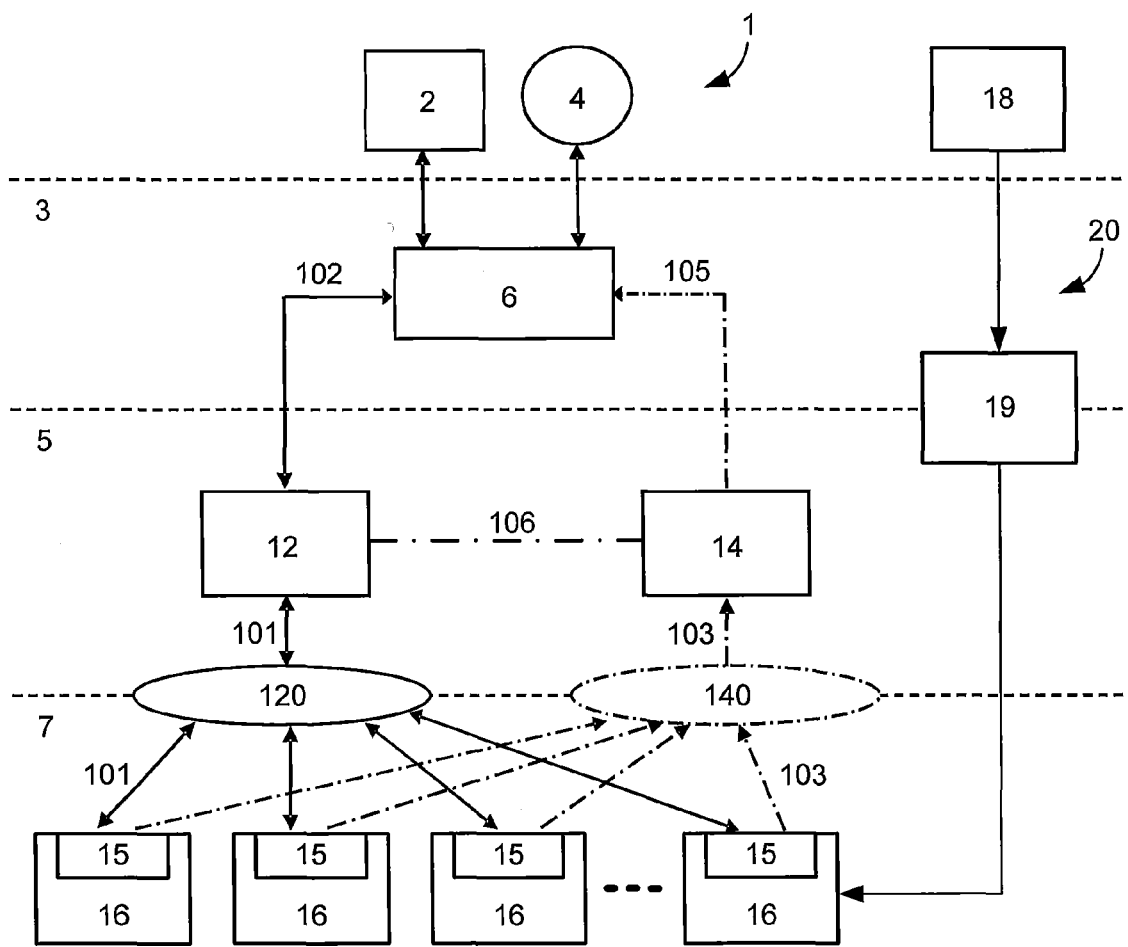
FIG. 1 is a schematic diagram of an embodiment of a network architecture for a lithography system according to the invention.

FIG. 1 is a schematic diagram of one embodiment of a lithography system 1 with control and data interfaces according to the invention. The diagram shows a hierarchical arrangement with three interfaces, a cluster interface 3, cluster element interface 5, and the lithography subsystem interfaces 7. FIG. 1 one illustrates a configuration with a lithography system cluster comprising one lithography element, which comprises multiple lithography subsystems 16. The lithography system may comprise multiple lithography elements 10, e.g. as in the FIG. 2 embodiment.

The cluster interface 3 comprises interfaces for communication between a lithography cluster front-end 6 and one or more host systems 2, and/or between the cluster front-end 6 and one or more operator consoles 4.

The cluster element interface 5 comprises interfaces for communication between the cluster front-end 6 and a lithography element network comprising a element control unit 12 and/or a data network hub 14. The element control unit 12 may be in communication with a data network hub 14 via link 106, wherein the communication is preferably uni-directional from the element control unit 12 to the data network hub 14.

The lithography subsystem interface 7 comprises interfaces between the element control unit 12 and the lithography subsystems 16, and between the data network hub 14 and the lithography subsystems 16. The subsystems 16 communicate with the element control unit 12 via control network 120, and the subsystems 16 communicate with the data network hub 14 via data network 140.

Figure 2:
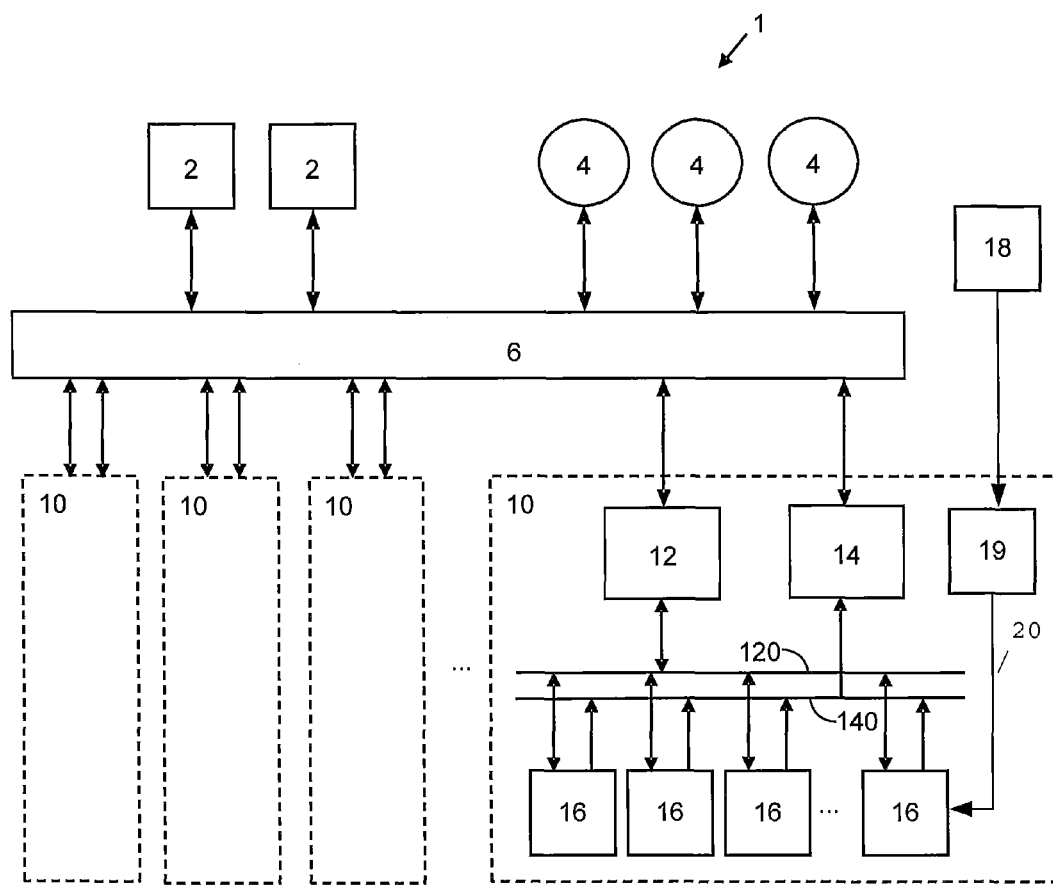
FIG. 2 is a schematic diagram of an embodiment of a network architecture for a lithography system comprising a cluster of lithography elements.

FIG. 2 is a schematic diagram of an embodiment of a lithography system 1 in which the lithography system cluster comprises multiple lithography elements 10, each element comprising multiple lithography subsystems 16. Each element may comprise a element control unit 12 and data network hub 14 communicating with the lithography subsystems 16 for the element. Each element may function as a stand-alone lithography element which is able to operate independently to expose wafers using a lithography process. In this embodiment, the multiple lithography elements 10 each communicate with a single front-end 6, and the front-end 6 communicates with one or more host systems 2 and/or operator interfaces 4 which function for the entire cluster.

The embodiments in FIGS. 1 and 2 are preferably designed to facilitate efficient control of a cluster of lithography elements. Each lithography element 10 preferably only has network interfaces, to the control network 120 and data network 140. An exception to this design rule is the data path 20 directly connecting the pattern streamer 19 to the subsystem(s) responsible for modulating or switching the charged particle beams. The pattern data is initially prepared in the pattern data processing system 18 and sent to pattern streamer 19 for data conversion and streaming to the subsystems. This design is due to the extremely high volume of pattern data transferred to the relevant subsystem(s). The pattern data is typically streamed to the relevant subsystems in a bit-map format, since the quantity of data is too great for local storage at the subsystem.

The operator interfaces and interfaces to higher-level host supervisory and automation computers are made not with the individual lithography elements but at the cluster front-end 6. This enables such interfaces to be developed for the cluster without requiring knowledge of the interface protocol to the lithography elements 10 and without placing additional demands and interfering with communication across the control network 120 and data network 140.

Figures 3, 4:
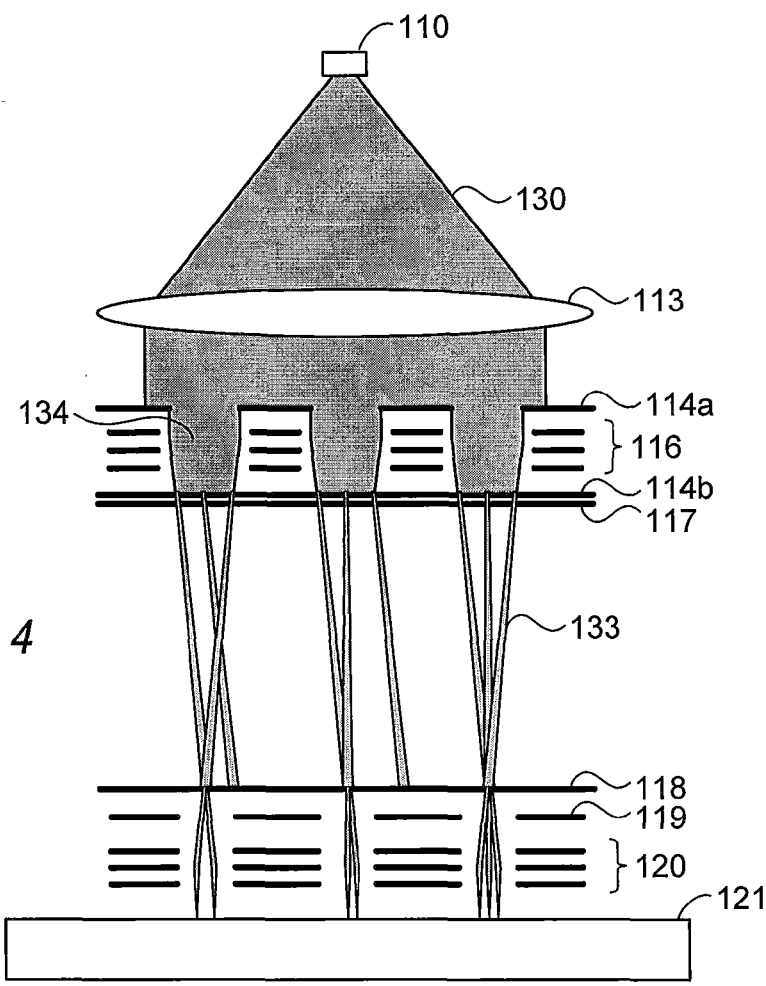
FIG. 3 is a diagram of a layout of a cluster of lithography elements.
FIG. 4 is a simplified diagram of an electron-optical column of a charged particle lithography element.

FIG. 3 shows a simplified top view of a lithography system cluster 100. In this embodiment, the cluster comprises a group of ten lithography elements 10, arranged back-to-back in two rows of five. Directly adjacent to the cluster 100, floor space is reserved as service area. Each lithography element comprises an electron-optical column contained in its own vacuum chamber, with one side of each vacuum chamber facing a substrate delivery system 22 and service area. The substrate delivery system 22 receives substrates from a substrate supply system 24 and supplies them to the lithography elements 10 for processing, and receives processed substrates from the lithography elements 10 and supplies them to the substrate supply system 24 for transfer to other systems in the fab.

In case of a charged particle lithography apparatus, the vacuum chamber preferably encloses the charged particle source and components for generating multiple charged particle beamlets, a beam modulation system switching or modulating the beamlets, a projector system for projecting the beamlets onto a substrate to be patterned, and a moveable substrate stage. The vacuum chamber preferably includes a load lock system for transferring substrates into and out of the vacuum chamber from the substrate delivery system 22, and also an access door facing the service area that can be opened for service access to the electron-optical column.

Each lithography element 10 operates independently to receive and process wafers. Each lithography element includes its own computer processing systems for processing data and operating the components and subsystems of the lithography element. Each lithography subsystem 16 preferably has its own computer processor and memory system, to execute commands to direct the operations of the subsystem, collect data resulting from operation of the subsystem, and communicate with the control and data networks. The element control unit 12 and data network hub 14 preferably each comprise their own computer processor and memory system for performing their functions. The computer processor and memory systems for the element control unit 12, data network hub 14, and subsystems 16 for a lithography element 10 may be located in close proximity to the vacuum chamber for the lithography element, e.g. in a cabinet mounted above the vacuum chamber, of in a basement below the vacuum chamber, or part in each location.

The back-to-back layout of the lithography elements of the cluster provides a system with a limited footprint, and placement of the computer processor and memory systems directly above or below the vacuum chambers also reduces the footprint. Floor space within a fab is valuable, and efficient use of the fab floor space is thus important.

FIG. 4 shows a simplified schematic diagram of an electron-optical column of a charged particle lithography element. Such lithography systems are described for example in U.S. Pat. Nos. 6,897,458; 6,958,804; 7,019,908; 7,084,414; and 7,129,502, U.S. patent publication no. 2007/0064213, and co-pending U.S. patent application Nos. 61/031,573; 61/031,594; 61/045,243; 61/055,839; 61/058,596; and 61/101,682, which are all assigned to the owner of the present invention and are all hereby incorporated by reference in their entireties.

In the embodiment shown in FIG. 4, the lithography element column comprises an electron source 110 producing an expanding electron beam 130, which is collimated by collimator lens system 113. The collimated electron beam impinges on an aperture array 114a, which blocks part of the beam to create a plurality of sub-beams 134, which pass through a condenser lens array 116 which focuses the sub-beams. The sub-beams impinge on a second aperture array 114b which creates a plurality of beamlets 133 from each sub-beam 134. The system generates a very large number of beamlets 133, preferably about 10,000 to 1,000,000 beamlets.

A beamlet blanker array 117, comprising a plurality of blanking electrodes, deflects selected ones of the beamlets. The undeflected beamlets arrive at beam stop array 118 and pass through a corresponding aperture, while the deflected beamlets miss the corresponding aperture and are stopped by the beam stop array. Thus, the beamlet blanker array 117 and beam stop 118 operate together to switch the individual beamlets on and off. The undeflected beamlets pass through the beam stop array 118, and through a beam deflector array 119 which deflects the beamlets to scan the beamlets across the surface of target or substrate 121. Next, the beamlets pass through projection lens arrays 120 and are projected onto substrate 121 which is positioned on a moveable stage for carrying the substrate. For lithography applications, the substrate usually comprises a wafer provided with a charged-particle sensitive layer or resist layer.

The lithography element column operates in a vacuum environment. A vacuum is desired to remove particles which may be ionized by the charged particle beams and become attracted to the source, may dissociate and be deposited onto the machine components, and may disperse the charged particle beams. A vacuum of at least $10^{-6}$ bar is typically required. In order to maintain the vacuum environment, the charged particle lithography system is located in a vacuum chamber. All of the major elements of the lithography element are preferably housed in a common vacuum chamber, including the charged particle source, projector system for projecting the beamlets onto the substrate, and the moveable stage.

Subsystems

In the embodiments of FIGS. 1 and 2, each lithography element 10 forms an independently operating lithography element for exposing wafers. Each lithography element 10 comprises multiple subsystems 16 which operate to perform the functions required for the element. Each subsystem performs a specific function. Typical subsystems 16 include, for example, a wafer load subsystem (WLS), wafer positioning subsystem (WPS), an illumination optics subsystem (ILO) for generating electron beamlets, a pattern streaming subsystem (PSS) for streaming beam switching data to the lithography element, a beam switching subsystem (BSS) for switching the electron beamlets on and off, a projection optics subsystem (POS) for projecting beamlets onto the wafer, a beam measurement subsystem (BMS), a metrology subsystem (MES) etc. Each lithography element 10 is preferably configured for receiving wafers, clamping each wafer to a chuck and preparing the clamped wafer for exposure, exposing the clamped wafer, and unclamping the exposed wafer from the chuck and presenting the exposed wafer for removal from the element.

Each subsystem 16 may comprise one or more modules which are dedicated to a particular sub-functions and are preferably designed as replaceable components. The modules may comprise actuators and sensors, actuators which are able to perform a command and sensors which are able to detect actions and results and take measurements during, before and/or after performing a command. Examples of such modules include the stage for movement of the substrate during exposure, the control computer for control of the stage, the projection lens module supplying voltages to lens arrays for projecting the beamlets onto the substrate, a vacuum pump for generating a vacuum in the vacuum chamber, etc.

Each subsystem 16 operates independently and includes a memory for storing instructions and a computer processor for executing the instructions. The memory and processor may be implemented in each subsystem as a plug-in client (PIC) 15. A suitable implementation of a subsystem may include, for example, a personal computer running the Linux operating system. The subsystems may include a hard disk or non-volatile memory for storing their operating system so that each subsystems boots from this disk or memory. These and other features discussed below enable a design where each subsystem is an autonomous unit which can be designed, built and tested as an independent unit without needing to consider constraints imposed by other subsystems. For example, each subsystem may be designed with sufficient memory and processing capacity to properly perform the functions of the subsystem during its operating cycle, without needing to take into account the demands on memory and processing capacity made by the other subsystems. This is particularly advantageous during development and upgrade of the system, when these requirements are in flux. Disadvantages of this design are that the total required memory and processing capacity is increased, and redundancy of these components must be implemented within each subsystem. However, these disadvantages are outweighed by the simplified design leading to faster development and simpler upgrade.

The subsystems 16 are designed to receive commands via the control network 120 and execute the commands independently from the other subsystems, reporting results for the command execution and transferring any resulting execution data upon request.

The subsystems 16 may be designed as autonomous units, but designed to boot from a central disk or memory, for example on the data network hub. This reduces the reliability problem and cost of individual hard disks or non-volatile memory in each subsystem, and permits more easy software upgrade of a subsystem by updating the boot image for the subsystem in the central location.

Communication Protocols

The subsystems 16 are connected via a control network to a element control unit 12, also referred to as a Support Subsystem Control or SUSC. The element control unit 12 comprises memory and a computer processor for controlling operation of the subsystems for the lithography element 10.

Communication 102 between the cluster front-end 6 and SUSC 12 is designed for transfer of PPs to the SUSC 12. A protocol based on JavaScript Object Notation (JSON) may be used. JSON is a text-based open standard designed for human-readable data interchange, used for representing simple data structures and arrays, and is suitable for serializing and transmitting structured data over a network connection. Access to the protocol is preferably restricted to users at the cluster, and not to users outside the clean-room environment. The protocol preferably provides an instruction for creation of PJs, transferring the PP file and any associated parameters, to instruct the SUSC 12 to create a PJ based on the PP. Additional commands may include Abort and Cancel instructions. Communication from the SUSC 12 to the cluster front-end 6 may include acknowledgment messages, progress reporting, and error and alarm messages.

Communication 101 between the SUSC 12 and lithography subsystems 16 across control network 120 is preferably strictly controlled using only the element control unit protocol to ensure a quasi real-time performance in the network.

Communication 105 between data network hub 14 and cluster front-end 6 is designed for retrieval of PJ results, job tracing and data logging from the data network hub 14. A Hyper-Text Transfer Protocol (HTTP) may be used for this communication link.

Communication 103 between the lithography subsystems 16 and SUSD 14 is designed for one-way collection of data from the subsystems 16. The data may be communicated using a variety of protocols, such as syslog, HDF5, UDP and others.

High volume data may be sent using a User Datagram Protocol (UDP) to send data without the large overhead of handshaking, error checking and correction. Due to the resulting very low transmission overhead, the data can thus be regarded as being received in real-time.

The hierarchical data format HDF5 may be used for transmission and storage of the high-frequency data. HDF5 is well suited to storing and organizing large amounts of numerical data, but is usually not used in a UDP environment. Other data formats such as CSV or TCP can also be used, particularly for low level (low volume) data.

Process Program

The operation of the lithography element 10 is controlled using a process program (PP) 11, which comprises a sequence of actions to be performed. The element control unit 12 is loaded with a PP, and schedules and executes the PP as requested by a host system 2 or an operator though an operator console 4. The PP may take the role of a recipe, e.g. as defined in the SEMI E40 standard. Although the SEMI standards specify many requirements on how to deal with recipes, the standards may be contradictory so that recipes are preferably avoided. Instead, editable and unformatted PP are used in the form of so-called Binary Large Objects (BLOBs).

The PP as the pre-planned and reusable portion of the set of instructions, settings and parameters that determines the processing environment of the wafer and that may be subject to change between runs or processing cycles. PPs may be designed by the lithography tool designers or generated by tooling.

PPs may be uploaded to the lithography system by the user. PPs are used to create Process Jobs (PJs). A Process Job (PJ) specifies the processing to be applied to a wafer or set of wafers by a lithography element 10. A PJ defines which PP to use when processing a specified set of wafers and may include parameters from the PP (and optionally from the user). A PJ is a system activity started by a user or host system.

PPs may be used not only for controlling the processing of wafers, but also for service actions, calibration functions, lithography element testing, modifying element settings, updating and upgrading software, etc. Preferably no subsystem behavior occurs other than what is prescribed in a PP, with the exception of certain allowed additional categories, such as automatic initialization during power-up of a module or subsystem, periodic and unconditional behavior of a subsystem, as far as those don't influence PJ execution, and the response to an unexpected power-off, emergency or EMO activation.

A PP is divided into steps. Most steps comprise a command and identify a subsystem which is to perform the command. The step may also include parameters to be used in performing the command, and parameter constraints. The PP may also include scheduling parameters to indicate when a step is to be performed, e.g. to be performed in parallel, in sequence, or synchronized.

To execute a command step of the PJ, the element control unit 12 sends the command indicated in the PJ to the subsystem indicated in the relevant step of the PJ. The element control unit 12 monitors timing and receives the results from the subsystem. Examples of execution of specific commands are described below.

Plug-In Commands Concept

The element control unit (SUSC) 12 converts a PP (which represents a logical plan) into a schedule of subsystem actions. The system may be designed so that the SUSC 12 does not have a-priori knowledge of which subsystems 16 are installed, and which subsystem commands exist and what their properties are. In this case, this information is provided to SUSC 12 at runtime by the subsystems 16 during startup.

Each subsystem 16 may be designed to report their presence and capabilities to SUSC 12 when the subsystem is powered up and initialized. The subsystem establishes communication over the control network 120 and reports to SUSC 12 its identity and status, and may also report its capabilities such as which commands it is capable of performing. The SUSC 12 may perform a check before or during execution of a PP that each subsystem required for the PP has reported its presence and a ready status, and may also check that each subsystem has reported its capability to perform the commands required for the subsystem in the PP.

This self-reporting by the subsystems enables the lithography system to be extended or upgraded with new functionality using only localized software upgrades to the subsystems, or even with no software upgrade at all. For example, a certain subsystem 16 may have its software upgraded so that it can execute a new command. The SUSC 12 may now be loaded with a new PP which includes the new command for the upgraded subsystem. When the upgraded subsystem 16 is powered up it communicates with the element control unit 12, indicating its identity and status, and which commands it can execute, including the new command. The SUSC 12 schedules the PP to generate a PJ including the step commanding the subsystem to execute the new command. The SUSC 12 may perform a check that the upgraded subsystem has reported it is able to perform the new command. This upgrade thus only requires an upgrade of the relevant subsystem and of the PP, but not of SUSC 12 or any of the other subsystems 16.

Control Network

The control network 120 preferably does not use a real-time communication protocol, but nevertheless is designed to provide quasi real-time performance, providing for communication between the subsystems and SUSC 12 having high repeatability, e.g. a repeatability substantially within 1 millisecond, to provide for execution of the same job under same conditions resulting in the same timing behaviour.

This quasi real-time performance across the control network 120 may be achieved by implementing some or all of the following measures.

(a) The lithography system schedules each PP to generate a PJ prior to starting execution of the PJ, determining the time for starting (and may also include time for completing) each step of the PJ. The scheduled start time (and completion time) for each step and of the complete PJ may be completely determined before the PJ is initiated, and these times may be reported to the cluster front-end.

(b) The PP (and PJ) may be designed with no conditional steps or actions, and no retries. The steps of the PP/PJ describe a sequence of actions, although actions within a lithography element may be performed in parallel, e.g. commands executing in parallel on different subsystems. A conditional step or action may be programmed in a PP by defining two (or more) alternative steps to perform, where the alternatives steps are arranged as parallel paths. The alternative steps are scheduled in the PJ as parallel paths each assigned the same execution time, so that the execution time of the PJ as a whole does not vary depending on which alternative path is selected for execution on the subsystems.

The execution time of the steps of the PJ are not conditional upon the results of a preceding or parallel step, but are executed according to the predetermined schedule. If a step does not complete correctly or within the scheduled time, it will not be executed again (i.e. there are no retries), but instead the next scheduled step will be executed.

(c) After scheduling, every step will be executed by the SUSC 12 at its predetermined scheduled time, preferably within a timing accuracy of about 1 millisecond. At the scheduled time, the SUSC 12 will execute the relevant step and send any command for that step to the relevant subsystem 16 for execution by the subsystem. The scheduled timing in SUSC 12 is not dependent upon feedback from the subsystems 16 regarding successful completion or even failure to execute a command from a preceding step. Where a step defines an execution time period, the SUSC 12 waits for that time period to elapse before proceeding to the next step of the PJ. If a subsystem returns a result from execution of a command before expiration of this period, the SUSC 12 will still wait for expiration of the time period before proceeding to the next step. If a subsystem fails to returns an error message, the SUSC 12 will nevertheless wait for expiration of the time period and will then proceed to the next step. The operator or host system will determine what corrective action may be necessary if a subsystem fails to properly execute a command.

Any timing variation in execution of a step is accounted for in the scheduling, so that the scheduled time for execution of a step is greater than the greatest expected execution time. The time schedule is typically defined in the PP. The scheduling moment may be "just-in-time" before execution starts, or some time before execution, e.g. when adding the step to an execution queue.

(d) The commands sent and executed by the subsystems 16 specify execution of the command with a fixed maximum time. The greatest execution time is the pre-determined maximum period as determined by a subsystem given it's circumstances. The operator or host system will determine what corrective action may be necessary if this time is exceeded.

(e) When executing a PJ step which has a command for a subsystem to perform and data associated with the command to be sent to the relevant subsystem, the data may be transmitted to the subsystem in advance of the command itself being sent to the subsystem. The data is transmitted in one or more messages so that any one message is limited in size. The data is sent sufficiently in advance to ensure that it has been received by the subsystem, i.e. the time between sending the data and sending the command is much larger than the expected transmission time, and the subsystem may acknowledge receipt of the data. This enables the larger messages containing the data to be sent in advance when timing is not critical, and a much smaller message containing only the command (without associated data) can be sent at the scheduled time. This measure distributes load on the network and avoids congestion when the command is sent, to reduce transmission time and increase timely and reliable transmission of the command.

(f) Similarly, when a subsystem completes execution of a command, it may send a short message to SUSC 12 indicating that the command has completed, but holds any data resulting from execution of the command for retrieval by SUSC 12 at a later time. When SUSC 12 receives the indication of command completion, it can then send a request to the subsystem to retrieve the resulting data. This distributes load on the network and avoids congestion when the command completion indication is sent, to reduce transmission time and increase timely and reliable transmission, and the data can then be retrieved later when timing is not critical.

(g) The message interchange between the subsystems 16 and SUSC 12 include reply messages to acknowledge receipt of instructions from SUSC 12. The reply messages carry no other information other than a confirmation that the subsystem 16 has received the relevant message from SUSC 12 and is still functioning. This enables the SUSC 12 to detect when a subsystem 16 has stopped responding as expected, so that this can be reported to the cluster front-end in a timely manner. To keep the software implementation simple, there are no timeouts for a subsystem 16. The total response time expected for reply messages is typically short, e.g. less than 0.5 ms round trip. To detect a non-responsive subsystem 16, SUSC 12 has a timeout that far exceeds the expected response time, e.g. 30 seconds after a response is expected. This timeout is large enough to conclude beyond reasonable doubt that a subsystem 16 is not functioning, but is small enough to detect a failure before an operator 4 would normally do so, so that the operator 4 does not have to wonder what is going on.

(h) The control network 120 includes a protocol controller secure a single transfer of a data package, e.g. a single message sequence, at a time.

(i) The control network uses a simple transmission protocol, e.g. byte protocol on TCP link. Transmission protocols which are complex or which include unpredictable elements are avoided. The protocol used on the control network ensures that multiple data transfers can not take place simultaneously, so that unpredictable events on the network do not occur.

A TCP connection consists of two byte streams, one in each direction. The protocol splits both of these streams up into discrete messages, each message a sequence of 0 or more bytes of arbitrary data, preceded by 4 bytes indicating the length of the sequence. This length may be encoded as an unsigned integer, e.g. a 32-bit integer in network order ("big-endian"), providing a maximum message size of $(2^{32}-1)$ bytes. This message separation mechanism may be implemented by "Connection Objects" in the Python programming language. By using the standard multiprocessing connection package, Python itself can handle this part of the protocol. In other programming environments it would be necessary to implement this aspect explicitly. Messages can be initiated by either side provided these follow the prescribed sequences.

Every first message of a message sequence may contain a control data structure encoded in JavaScript Object Notation (JSON). All of the SUSC protocol JSON messages may have the same general structure: an array of 2 elements, the first containing a string with the message type and the second a dictionary with the named arguments for that message, e.g. ["<messageType>", {"param1": <value1>, "param2": <value2>, ... }]

In some message sequences, e.g. those used to transfer input and output items of interface commands, this control/command message is immediately followed by several data messages, e.g. one data message per input/output item. The protocol makes no assumptions about the encoding used in these messages, the interpretation instead being described in a design document specifying subsystem commands, data and behavior, e.g. "list of tuples of 2 floats, encoded with pickle", or "pressure curve plot as image/pgn").

This scheme of mixing arbitrary messages with JSON control messages allows process job outputs to be produced by plug-in software directly in a data format that is understandable by the operator, such CSV, PDF, PNG. It also means that the transmission of such objects can be done without additional encoding or escaping as part of the data stream, for example by using Linux's sendfile function. This freedom can also be used to specifically agree between subsystems on an encoding that is more appropriate for the specific interface function. However, it would be unwise if every subsystem has its own data encoding scheme, so if a subsystem has no specific requirements a default scheme should be chosen to implement the best trade-off among the requirements.

(j) The subsystems are is not responsible for verifying correct behavior of SUSC 12 and detect SUSC protocol errors, to simplify the PIC 15 design. The purpose of the SUSC protocol is to execute process steps from process programs in process jobs created by the user. Exceptions are used to communicate unexpected behavior to the user. Besides errors in command execution of course also errors could occur by not complying with the SUSC protocol. The SUSC 12 is responsible to log exceptions and may close the connection to a PIC when the PIC is not behaving according to the SUSc protocol (or has stopped responding altogether), but that a PIC is not responsible for verifying the correct behavior of SUSC to keep the PIC requirements simple. If a protocol violation is encountered by a PIC, it might or might not respond gracefully to it and there is no requirement that subsequent messages must be understood. It is recommended to attempt to log some diagnostics, log an exception, disconnect and reconnect when a message can't be handled. This is a recommendation, not a requirement, as there can be no guarantee or expectation that after such reconnect the PIC is in again in an usable state (but at least it would be in a more or less understandable state).

(k) The interfaces for the operators and higher-level automation or supervisory fab computer systems are removed from the communications on the control network 120. These interfaces are provided from the cluster front-end 6, so that they do not generate congestion on the control network 120 and do not influence timing of communications with the subsystems 16.

(l) Data collection is completely separated in a separate data network 140 from the control communications on the control network 120. This separation of functions is discussed in more detail below.

Sync Clock

The lithography system provides a clock signal on the control network to enable synchronization of actions within the system and by the subsystems. The system may provide two clock signals at different frequencies to provide clocks to the subsystems for different timing accuracies, e.g. one clock signal accurate in milliseconds and one in nanoseconds. For example, the pattern streaming subsystem for streaming beam switching data and the beam switching subsystem for switching the electron beamlets on and off need to exchange data at very high frequency to enable high frequency switching of the beamlets, and the beam measurement subsystem is required to send beam position measurements at very high frequency. Other functions that need a high precision clock include the substrate positioning system and projection optics system. These subsystems are fed by and capable of receiving nanosecond clock pulses provided by a sync clock subsystem.

Data Network

The subsystems 16 are connected via data network 140 to data network hub 14. Data collection, storage and management is performed via the data network 140. The control network 120 forms a control network path between the element control unit 12 and the lithography subsystems 16, and the data network 140 forms a data network path between the data network hub 14 and the lithography subsystems 16. The control network 120 and data network 140 are physically separate networks. Each network has its own separate physical media, including wiring, network components such as switches, and network connections to the subsystems 16. Thus the control network path and the data network path comprise physically separate media and form separate and independent communication paths.

Each lithography subsystem 16 has a connection to the control network 140 adapted to receive and transmit control information from and to the element control unit 12 via the control network. Each lithography subsystem 16 has a separate connection to the data network 140, adapted to transmit data information to the data network hub 14 via the data network.

The data network 140 is designed with a bandwidth much greater than the transmission rates used by the subsystems 16. For example, the data network 140 may have a bandwidth of 1 Gbit/s and the subsystems designed to transmit at 100 Mbit/s. In the data network there is no network controller or coordination of data transfers. Typically in the data network 140, a data exchange cap is set at 140 Mbit between the subsystems 16 and the data network 140, whereas a cap of 1 Gbit is set on a data exchange between the data network 140 and data network hub 14. A network switch is included in the data network 140 to merge traffic, to prevent (data) package collision.

The data network hub 14 is adapted to continuously log data received from the subsystems 16. This data may include measurement data taken by the subsystems during a execution of a PJ, settings of the subsystems, and data for debugging and fault tracing. The data network hub 14 preferably is always logging all data, including low-level tracing data, so there is no need to turn on data logging. This continual data logging speeds up problem diagnosis, reducing the need to rerun and reproduce an error or problem.

The element control unit 12 is connected to the data network hub 14 to send information relating to the progress of PJs executing in the element control unit 12 for logging by the data network hub 14. The data network hub 14 continuously logs the data received from the element control unit 12.

Data network hub 14 includes very large data storage capacity, sufficient for storage of very large quantities of low level data from all subsystems 16 over a long operating time period, e.g. in the order of months or years. The data stored by data network hub 14 is organized and tagged, preferably with a time stamp and PJ identifier. The stored data can be retrieved from the data network hub 14 and analyzed and filtered, preferably off-line.

Separation of data collection via the data network 140 from control communications via the control network 120, enables high frequency collection of high volume data across the data network without compromising communications across the control network. The control network is enabled to operate in quasi real-time by controlling congestion on the control network 120, and avoiding the high volume traffic present on the data network 140. Separation of data management and storage functions in the data network hub 14 and PJ execution in the element control unit 12, enables processing of high volumes of data by the data network hub 14 without compromising the processing of PJs by the element control unit 12. The separation of control and data collection and management enables a simpler design without needing to account for interaction between the two systems.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

What is claimed is:

1. A clustered substrate processing system comprising a plurality of lithography elements, each lithography element arranged for independent exposure of substrates according to pattern data, and each lithography element comprising:
   a plurality of lithography subsystems;
   a control network arranged for communication of control information between the lithography subsystems and at least one element control unit, the element control unit arranged to transmit commands to the lithography subsystems and the lithography subsystems arranged to transmit responses to the element control unit; and
   a data network arranged for communication of data logging information from the lithography subsystems to at least one data network hub, the lithography subsystems arranged to transmit data logging information to the data network hub and the data hub arranged for receiving and storing the data logging information, wherein the control network and the data network are physically separate networks,
   the system further comprising a cluster front-end for interface to an operator or host system, the cluster front-end arranged for transmitting control information to the at least one element control unit to control operation of the lithography subsystems for exposure of one or more wafers, and the cluster front-end further arranged for receiving at least a portion of the data logging information received by the data network hub,
   and the system further comprising a data path arranged for transmission of the pattern data to one or more of the lithography subsystems, the data path forming a transmission path separate from the control network and the data network, the pattern data being transmittable to the one or more lithography subsystems without being transmitted over the control network or the data network, wherein the data path comprises a pattern streaming system.

2. System according to claim 1, wherein the control network forms a control network path between the element control unit and the lithography subsystems, and the data network forms a data network path between the data network hub and the lithography subsystems, and wherein the control network path and the data network path comprise physically separate media.

3. System according to claim 1, wherein each lithography subsystem has a first connection to the control network, the first connection arranged to receive the commands from and transmit the responses to the element control unit via the control network, and each lithography subsystem has a separate second connection to the data network, the second connection adapted to transmit the data logging information to the data network hub via the data network.

4. System according to claim 1, wherein the element control unit is arranged for communication to the data network hub of data relating to the commands transmitted to the lithography subsystems and the responses received from one lithography subsystem via the control network.

5. System according to claim 1, wherein, during operation of one of the lithography elements, the lithography subsystems of the lithography element are arranged to continuously transmit logging data to the data network hub via the data network.

6. System according to claim 1, wherein the data network hub stores information required for initializing the lithography subsystems, the initialization information for a lithography subsystem being transmitted to the lithography subsystem during start-up of the lithography subsystem.

7. System according to claim 1, wherein at least one of the lithography subsystems is arranged to communicate information to the element control unit upon start-up of the lithography subsystem, the information indicating a presence of the lithography subsystem on the control network and an identity of the lithography subsystem, and identifies one or more commands which the lithography subsystem is able to perform.

8. System according to claim 1, wherein the control network is arranged for communication of servicing information between the element control unit and the lithography subsystems, and the cluster front-end is adapted for issuing servicing information for performing servicing functions on the one or more lithography elements.

9. System according to claim 1, wherein the system is arranged to provide two clock signals to the lithography subsystems, one of the clock signals having a clock frequency at least 100 times higher than the other clock frequency, and wherein the lithography subsystems are arranged to use the clock signals to synchronize their actions.

10. System according to claim 1, wherein the lithography subsystems provide no interface to the operator or host system, such interface to the subsystems being provided solely via the cluster front-end.

11. System according to claim 1, wherein the lithography subsystems are arranged to transmit data to the data network at a first transmission rate and the data network hub is arranged to receive data from the data network at a second transmission rate, and wherein the second transmission rate is much greater than the first transmission rate.

12. A method for communication of data within a clustered substrate processing system comprising a plurality of lithography elements, each lithography element arranged for independent exposure of substrates according to pattern data, and each lithography element comprising a control network connecting an element control unit with a plurality of lithography subsystems, a data network connecting a data network hub with the plurality of lithography subsystems, and a cluster front-end, wherein the control network and the data network are physically separate networks, the method comprising:
   transmitting control information from the element control unit to one or more of the lithography subsystems via the control network;

transmitting responses from the lithography subsystems to the element control unit via the control network;

transmitting data logging information from the lithography subsystems to the data network hub via the data network;

receiving and storing the data logging information in the data network hub;

transmitting control information from the cluster front-end to the element control unit to control operation of the lithography subsystems for exposure of one or more of the substrates;

transmitting at least a portion of the data logging information stored by the data network hub to the cluster front-end; and transmitting pattern data to one or more of the lithography subsystems via a data path, the data path forming a transmission path separate from the control network and the data network, and the pattern data being transmittable to the one or more lithography subsystems without being transmitted over the control network or the data network, wherein the data path comprises a pattern streaming system.

13. Method according to claim 12, wherein the control information is transmitted to the lithography subsystems and the responses from the lithography subsystems are transmitted to the element control unit only via the control network, and the data logging information from the lithography subsystems is transmitted to the data network hub only via the data network.

14. Method according to claim 12, further comprising transmitting, from the element control unit to the data network hub, data relating to the commands transmitted to the lithography subsystems and the responses received from one lithography subsystem.

15. Method according to claim 12, wherein transmitting the data logging information from a lithography subsystem to the data network hub is performed continuously during performance of a command by the lithography subsystem.

16. Method according to claim 12, further comprising storing information required for initializing the lithography subsystems in the data network hub, and transmitting the initialization information to a lithography subsystem during start-up of the lithography subsystem.

17. Method according to claim 12, further comprising communicating information to the element control unit from one of the lithography subsystems upon start-up of the lithography subsystem, the information indicating a presence of the lithography subsystem on the control network and an identity of the lithography subsystem, and identifying one or more commands which the lithography subsystem is able to perform.

18. System according to claim 1, wherein the data network hub stores software updates, software upgrades or fixes for initialization information for subsequent download to one or more of the lithography subsystems.

19. System according to claim 1, wherein a process program comprises a pre-planned and reusable portion of a set of instructions, settings and/or parameters that determines a processing environment of a substrate, wherein the control information comprises the process program and the host system is arranged for providing the process program to the element control unit, and wherein the element control unit is arranged for creating a process job specifying a processing to be applied to a substrate by the lithography element based on the process program.

20. System according to claim 19, wherein the process program comprises instructions for updating or upgrading software.

21. System according to claim 20, wherein the data logging information comprises information about the updating or upgrading of the software.

* * * * *